(12) United States Patent
Dougherty et al.

(10) Patent No.: US 6,727,708 B1
(45) Date of Patent: Apr. 27, 2004

(54) BATTERY MONITORING SYSTEM

(75) Inventors: Thomas J. Dougherty, Waukesha, WI (US); William J. Wruck, Whitefish Bay, WI (US); Ronald C. Miles, Whitefish Bay, WI (US); Deeyu C. Chen, Oak Creek, WI (US); Michael L. Thompson, East Troy, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 0 days.

(21) Appl. No.: 10/313,983

(22) Filed: Dec. 6, 2002

Related U.S. Application Data

(60) Provisional application No. 60/337,183, filed on Dec. 6, 2001.

(51) Int. Cl.⁷ .......................... H02J 7/00; H01M 10/44
(52) U.S. Cl. ........................................ 324/427; 320/132
(58) Field of Search ................................. 324/426–428; 320/132, 134, 136

(56) References Cited

U.S. PATENT DOCUMENTS

| | | | | |
|---|---|---|---|---|
| 6,300,763 B1 | 10/2001 | Kwok | ........................ | 324/427 |
| 6,507,194 B2 * | 1/2003 | Suzuki | ........................ | 324/428 |
| 6,515,452 B2 * | 2/2003 | Choo | ........................ | 320/132 |

* cited by examiner

Primary Examiner—Pia Tibbits
(74) Attorney, Agent, or Firm—Foley & Lardner

(57) ABSTRACT

A battery monitoring system is disclosed. The system comprises a means for acquiring a value representative of a first period of time during which the battery will deliver a sufficient amount of power. The system also comprises a means for measuring a set of parameters comprising a voltage of the battery and a temperature of the battery during a second period of time. The system also comprises a means for predicting whether the battery will deliver the sufficient amount of power during a third period of time less than the first period of time. An output signal is provided if the means for predicting determines that the battery will deliver the sufficient amount of power during the third period of time. A system for determining whether a battery for a vehicle will deliver a sufficient amount of power for a sufficient amount of time is also disclosed.

25 Claims, 7 Drawing Sheets

US 6,727,708 B1

BATTERY MONITORING SYSTEM

CROSS-REFERENCE TO RELATED APPLICATIONS

This application claims priority to U.S. Provisional Patent Application No. 60/337,183 titled "BATTERY MONITORING SYSTEM AND METHOD" filed Dec. 6, 2001, which is hereby incorporated by reference.

FIELD

The present invention relates to a battery monitoring system. The present invention more specifically relates to a system for predicting whether the battery will perform in certain applications as expected in the future.

BACKGROUND

It is generally known to provide for a system for determining when to replace a battery of a vehicle. According to such known systems, a determination is made to replace the battery at a pre-selected time such as five years after installation of the battery. According to such known systems, a determination is also made to replace the battery when the perceived time required for the battery to crank the engine (cranking time) is longer than expected. However, such known systems have several disadvantages including that the battery may require replacement before such pre-selected time, and any perceived increase in the cranking time may be due to other factors unrelated to the battery (such as a faulty starter).

It is also generally known to provide for a system for determining when to replace a battery of a vehicle based on the voltage of the battery. According to such known systems, a determination is made to replace the battery when the voltage of the battery falls below a pre-selected value. However, such known systems have several disadvantages, including that they do not record the "history" of the battery during its use as would allow for a more accurate prediction of the capacity of the battery, notwithstanding the measured voltage.

Accordingly, it would be advantageous to provide a battery monitoring system for predicting whether the battery will perform in certain applications as expected in the future. It would also be advantageous to provide a system for determining when a battery for a vehicle should be replaced which accounts for the history of the battery during its use. It would be desirable to provide for a battery monitoring system having one or more of these or other advantageous features.

SUMMARY OF THE INVENTION

The present invention relates to a system for monitoring a battery for a vehicle. The system comprises a means for acquiring a value representative of a first period of time during which the battery will deliver a sufficient amount of power. The system also comprises a means for measuring a set of parameters comprising a voltage of the battery and a temperature of the battery during a second period of time. The system also comprises a means for predicting whether the battery will deliver the sufficient amount of power during a third period of time less than the first period of time. An output signal is provided if the means for predicting determines that the battery will deliver the sufficient amount of power during the third period of time.

The present invention also relates to a system for determining whether a battery for a vehicle will deliver a sufficient amount of power for a sufficient amount of time. The system also comprises a sensor configured to provide an input signal representative of a voltage of the battery during at least one of a first period over which the starter is disconnected from the battery, a second period over which the starter cranks the engine, and a third period over which the engine is started. The system also comprises a controller configured to determine a voltage of the battery during at least one of the first period, a minimum voltage of the battery during the second period, and a maximum voltage of the battery during the second period. The controller is configured to provide an output signal if the voltage of the battery is outside a range of pre-determined values during at least one of the first period, the second period, and the third period.

The present invention also relates to a system for determining whether a battery for a vehicle will deliver a sufficient amount of power for a sufficient amount of time. The system also comprises a means for providing a first input signal representative of a temperature of the battery during a period. The system also comprises a means for providing a second input signal representative of a voltage of the battery during the period. The system also comprises a means for providing a third input signal representative of a duration of the period. The system also comprises a means for determining an amount of life lost by the battery during the period corresponding to the first input signal, the second input signal, and the third input signal. The means for determining the amount of life lost by the battery during the period provides an output signal if the amount of life lost by the battery during the period is outside a range of pre-determined values.

DETAILED DESCRIPTION OF PREFERRED EMBODIMENTS

Figure 1:
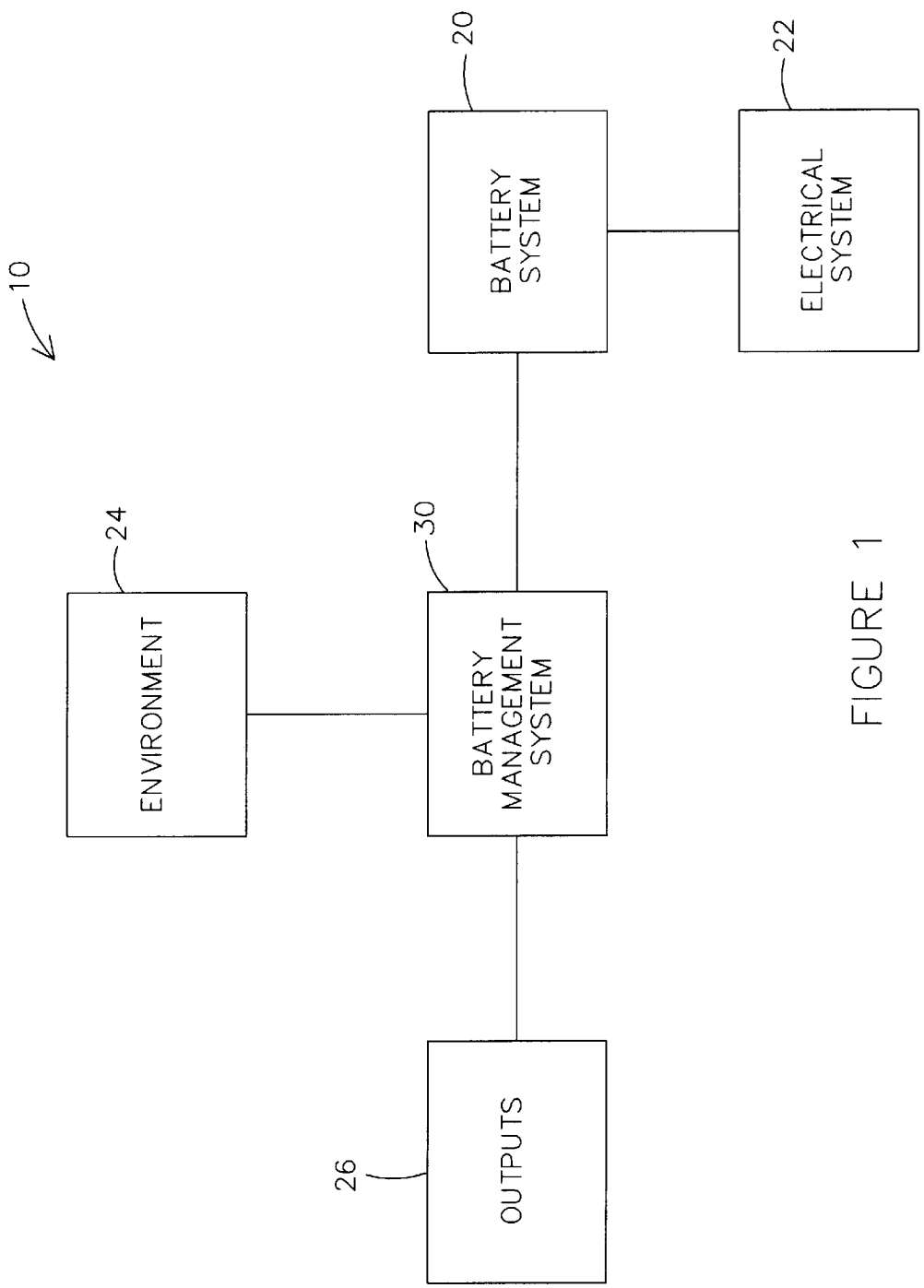
FIG. 1 is a schematic block diagram of a battery monitoring system according to an exemplary embodiment.

A battery monitoring system 10 as shown in FIG. 1 measures and records a set of parameters of a battery system 20 periodically during use over time. The parameters such as the voltage, temperature, state of charge and cycling of the battery may be acquired by a battery management system 30 from battery system 20, a vehicle electrical system 22, and an environment 24 according to a preferred embodiment, or may be otherwise acquired according to alternative embodiments.

System 10 predicts the ability of battery system 20 to perform in certain applications as expected in the future. Specifically, system 10 predicts whether battery system 20 has a sufficient remaining amount of "life" (i.e. may deliver a sufficient amount of power to the vehicle for a sufficient amount of time). In other words, system 10 predicts whether battery system 20 will likely be able to start the engine of the vehicle and power the loads of the vehicle.

A new, fully charged battery of battery system 10 has a fixed amount of "life." A certain amount of life is "lost" from battery system 20 during its use. For example, the cold cranking capability, reserve capacity and cycling capability of battery system 20 is reduced during its use of battery system 20. The extent to which the amount of life is lost from the battery depends on a variety of parameters, including the voltage, temperature, resistance, and state of charge of the battery system. An output signal 26 (such as a warning signal) that battery system 20 should be replaced is provided when system 10 predicts that battery system 20 will not likely perform for the intended use. (According to an alternative embodiment, another output signal comprises a signal to close a switch 40 (or switches) to connect the loads of an electrical system 22 to battery system 20 to "manage" operation of the battery system 20.)

One way system 10 predicts the amount of life remaining in battery system 20 is based on the monitored history or use of battery system 20. In general, the battery monitoring system sets a parameter intended to be representative of a battery "life." As the battery is in use over time, the battery monitoring system then subtracts a certain amount from the "life" based on the nature of the use. For example, a greater amount of life is subtracted if the battery undergoes a high voltage or temperature. The system also subtracts a greater amount of life if the battery is discharged to a great extent before it is recharged. Other uses may affect the extent to which the "life" is reduced.

Another way system 10 predicts the amount of life remaining in battery system 20 is based on a parameter monitored during cranking of the engine. In general, the battery monitoring system subtracts a greater amount of life if the battery takes a greater time to deliver a sufficient amount of power to crank the engine, or if the voltage of the battery drops dramatically during cranking of the engine.

Figure 2:
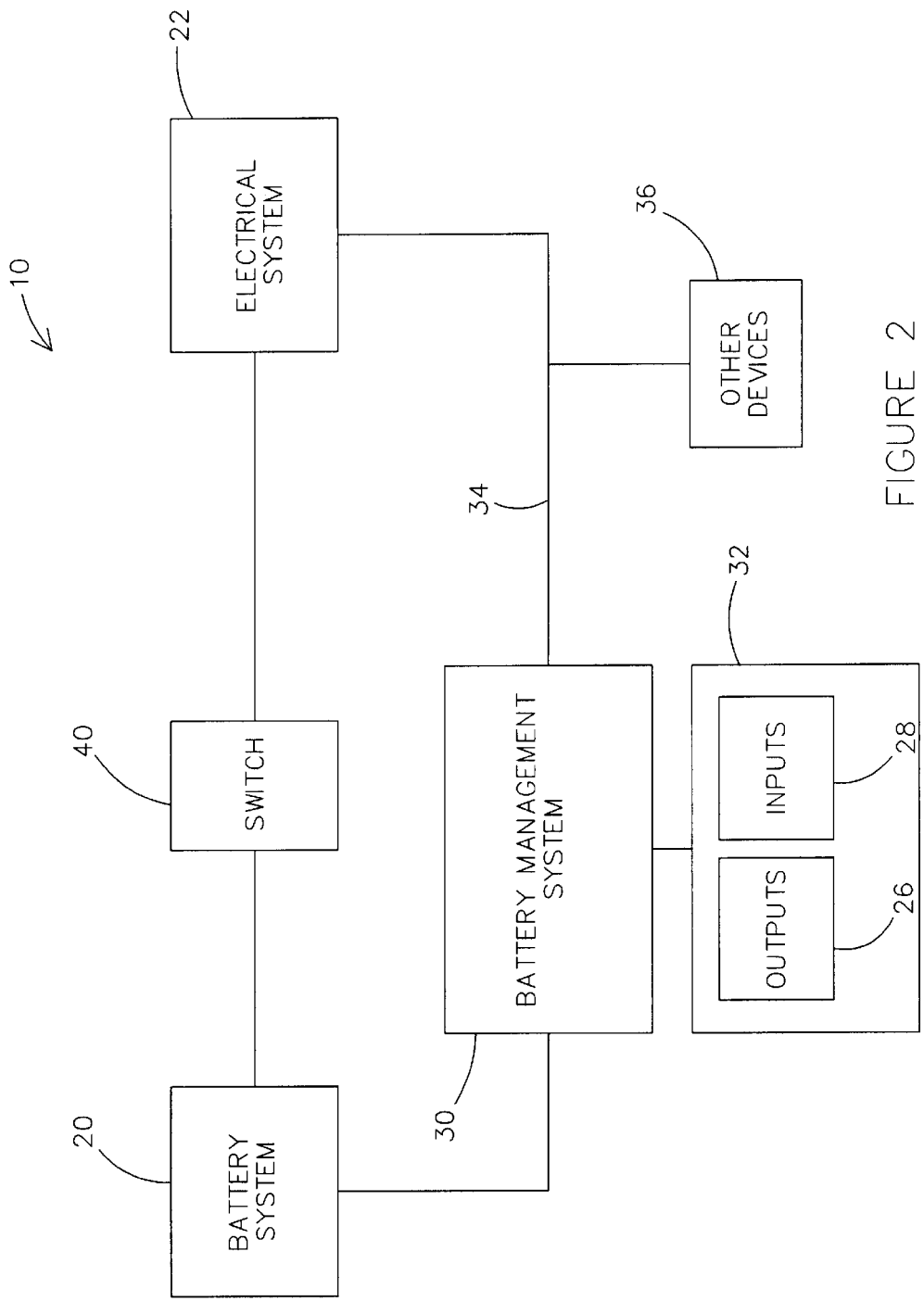
FIG. 2 is a schematic block diagram the battery monitoring system according to an alternative embodiment.

FIG. 2 shows system 10 according to an alternative embodiment. An input signal 28 representative of a condition or state of battery system 20 is provided to battery management system 30 by a sensor according to a preferred embodiment. Input signal 28 may also be provided to battery management system 30 by other devices 36 (such as a controller of a computing device for the vehicle as shown in FIG. 2) according to an alternative embodiment. Input signal 28 may also be provided to battery management system 30 by a network (shown as a CAN bus 34 in FIG. 2) according to another alternative embodiment. Input signal 28 may also be provided to battery management system 30 by a user interface 32 as shown in FIG. 2 according to a preferred embodiment.

Figure 3:
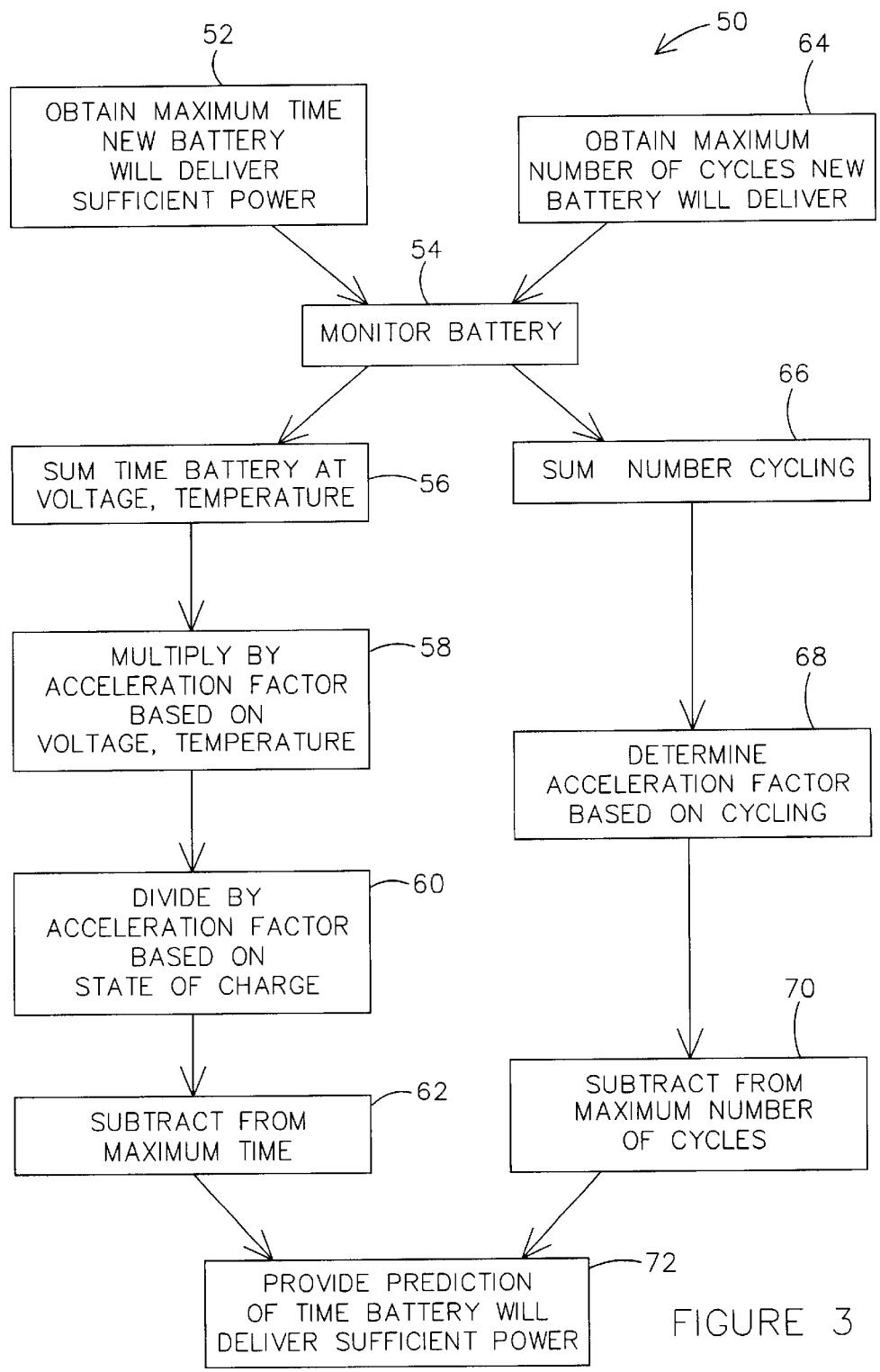
FIG. 3 is a flow diagram of a routine for predicting whether a battery may deliver a sufficient amount of power for a sufficient amount of time according to an exemplary embodiment.
Figure 4:
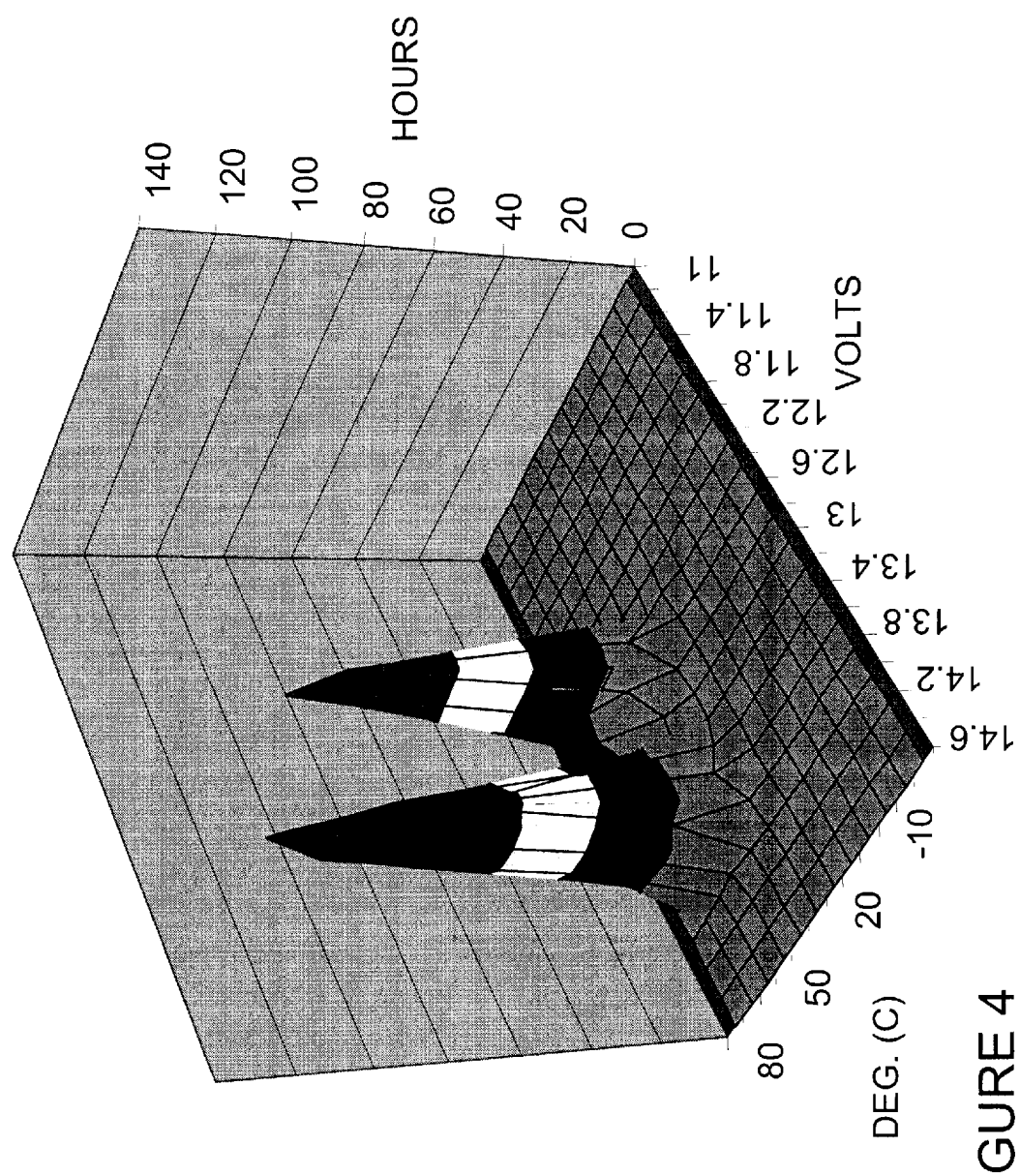
FIG. 4 is a graph showing the history of a battery according to an exemplary embodiment.

A routine 50 for predicting whether a battery of a battery system may deliver a sufficient amount of power for a sufficient amount of time is shown in FIG. 3. Routine 50 uses an input signal from a sensor (or otherwise acquired) representative of the voltage and temperature of the battery during use according to a preferred embodiment. The voltage and temperature of a battery is monitored and recorded over time according to a particularly preferred embodiment. The history of the voltage and temperature of a battery during use is shown in FIG. 4 according to an exemplary embodiment. As shown in FIG. 4 the battery is at about 50 degrees and about 13.5 volts for about 100 hours of use, and is at about 35 degrees and about 12.6 volts for about 5 hours of use.

Referring to FIG. 3, the amount of time a new, fully charged battery will deliver a sufficient amount of power for a sufficient amount of time is obtained as an input signal representative of the amount of "life" of the battery (step 52). This input signal is a pre-selected value such as 3300 days according to a preferred embodiment. Other input signals relating to parameters of the battery are also obtained from monitoring the battery (step 54). These input signals may relate to the voltage, temperature, time, cycling, state of charge, etc. of the battery according to alternative embodiments. The time the battery is at the specified voltage and temperature is summed (step 56).

The amount of life lost from the battery is determined based on the monitored parameters. If the battery undergoes at a high voltage or temperature during use, the amount of life lost from the battery is accelerated. An acceleration factor based on the voltage and temperature of the battery is pre-determined according to a preferred embodiment. The time the battery is at the voltage and temperature is multiplied by the acceleration factor based on voltage and temperature (step 58), resulting in a prediction of the amount of life lost of the battery due to voltage and temperature.

The amount of life lost from the battery is also determined based on the state of charge of the battery. If the battery undergoes a low state of charge, the amount of life lost from the battery is accelerated. An acceleration factor for each state of charge of the battery is pre-determined according to a preferred embodiment. The time the battery is at the state of charge is divided by the acceleration factor based on the state of charge (step 60), resulting in a prediction of the amount of life lost of the battery due to state of charge.

The time the battery is at the specified voltage and temperature (adjusted by the acceleration factors) is subtracted from the initial estimate of time the new, fully charged battery will deliver a sufficient amount of power for a sufficient amount of time (step 62). The result is a prediction of the amount of time (e.g. days) the battery may deliver a sufficient amount of power is then made (step 64).

Referring further to FIG. 3, the number of cycles a new, fully charged battery will deliver a sufficient amount of power is obtained as an input signal representative of the amount of "life" of the battery (step 66). A "cycle" is one discharge from 100 percent state of charge to complete discharge, plus one recharge to 100 percent state of charge. This input signal is a pre-selected value such as 1000 cycle counts according to a preferred embodiment. Other input signals relating to parameters of the battery are also obtained from monitoring the battery (step 54). The number of cycles of the battery is summed (step 66). If the battery undergoes a great discharge before it is recharged, the amount of life lost from the battery is accelerated. An acceleration factor based on the extent of cycling of the battery is pre-determined according to a preferred embodiment. The number of cycles of the battery is adjusted by the acceleration factor based on cycling (step 68). The number of cycles of the battery (adjusted by the acceleration factor) is subtracted from the initial estimate of the number of cycles of the new, fully charged battery (step 70) such as 1000 cycles or "counts." The result is a prediction of the number of cycle counts (or time) for which the battery may deliver a sufficient amount of power (step 72).

The steps for predicting whether a battery may deliver a sufficient amount of power for a sufficient amount of time is shown in TABLES 1–4 according to an exemplary embodiment. The time the battery is at a specified voltage, temperature and state of charge is continuously monitored during use of the battery in a vehicle according to a preferred embodiment. Over a 3.5 hour period, the battery is at the parameters shown in TABLE 1:

TABLE 1

| Temperature (degrees C) | Voltage (V) | Percent State of Charge (SOC %) | Time (hours) |
|---|---|---|---|
| 50 | 14 | 90% | 2 |
| 40 | 13 | 50% | 1 |
| 30 | 12 | 10% | 0.5 |
| | | | Sum =3.5hours |

The acceleration factor based on the voltage and temperature of the battery is determined (e.g. pre-determined from a lookup table stored in memory of the battery management system) according to a preferred embodiment as shown in TABLE 2:

TABLE 2

| | 12V | 13V | 14V |
|---|---|---|---|
| 50° C. | 7 | 9 | 10 |
| 40° C. | 4 | 5 | 8 |
| 30° C. | 1 | 2 | 6 |

The acceleration factor based on the state of charge of the battery is also determined (e.g. from a lookup table) according to a preferred embodiment as shown in TABLE 3:

TABLE 3

| State of Charge (%) | Acceleration Factor |
|---|---|
| 90% | 0.9 |
| 50% | 0.5 |
| 10% | 0.1 |

The amount of life or time lost from the battery during use is obtained by multiplying the time the battery was at the voltage and temperature (from TABLE 1) by the acceleration factor based factor voltage and temperature (from TABLE 2) and dividing by the acceleration factor based on the state of charge of the battery (from TABLE 3) as shown in TABLE 4:

TABLE 4

| Time (hours) | Acceleration Factor Based on Voltage and Temperature | Acceleration Factor Based on State of Charge | Time Lost (hours) |
|---|---|---|---|
| 2 | 10 | 0.9 | 22.2 |
| 1 | 5 | 0.5 | 10 |
| 0.5 | 1 | 0.1 | 5 |
| Sum =3.5hours | | | Sum =37.2hours |

The time the battery is at the specified voltage and temperature (adjusted by the acceleration factors) is subtracted from the initial estimate of time the new, fully charged battery will deliver a sufficient amount of power for a sufficient amount of time. Note the battery with parameters listed in TABLE 4 is used for 3.5 hours, but 37.2 hours are predicted to be lost from the battery (due to the acceleration factors).

The steps for predicting whether a battery may deliver a sufficient amount of power for a sufficient amount of time is shown in TABLES 5–7 according to an alternative embodiment. The cycling of the battery during discharge is continuously monitored during use of the battery in a vehicle according to a preferred embodiment. The battery is cycled the following amounts as shown in TABLE 5:

TABLE 5

| Period | Percentage of One Cycle |
|---|---|
| 1 | 61% |
| 2 | 50% |
| 3 | 10% |

The acceleration factor based on the cycling of the battery is determined (e.g. from a lookup table) according to a preferred embodiment) as shown in TABLE 6:

TABLE 6

| Percentage of One Cycle | Acceleration Factor Based on Cycling |
|---|---|
| 10% | 0.2 |
| 20% | 0.5 |
| 40% | 4 |
| 60% | 10 |

The amount of cycling (from TABLE 5) is adjusted by the acceleration factor based on cycling (from TABLE 6) for each period of use of the battery as shown in TABLE 7:

TABLE 7

| Period | Amount of Cycle (%) | Adjusted Cycle Counts |
|---|---|---|
| 1 | 61% | 10 |
| 2 | 50% | 4 |
| 3 | 10% | 0.2 |
| | | Sum =14.2counts |

The sum of the adjusted cycling counts is subtracted from the initial estimate of the number of cycling counts of the new, fully charged battery.

Figure 5:
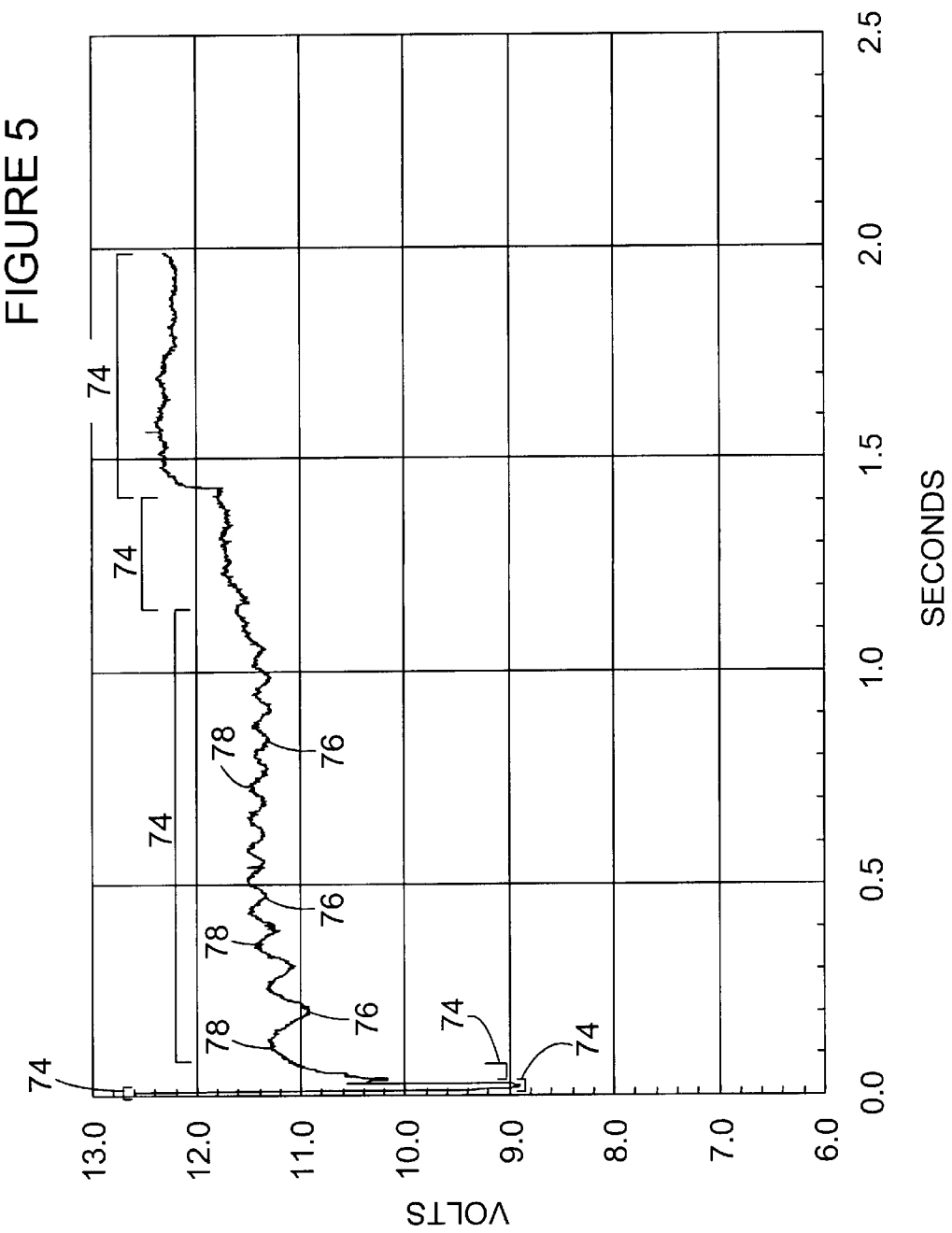
FIG. 5 is a graph of voltage versus time of a battery during the starting of an engine of a vehicle according to an exemplary embodiment.

Referring to FIG. 5, the voltage of a battery (at 100 percent state of charge and room temperature) during various times of use in a vehicle is shown according to an exemplary embodiment. The times comprise: a period 74a during which the voltage of the battery is not delivering or receiving power and all loads (including the starter) are disconnected from the battery—commonly referred to as "open circuit voltage"; a relatively short, subsequent period 74b during which the voltage of the battery initially drops (due to connection of the starter to the battery); a subsequent period 74c during which the voltage of the battery recovers; a subsequent period 74d during which the starter cranks the engine of the vehicle; a subsequent period 74e during which the engine of the vehicle is started (and the starter remains connected to the battery); and a subsequent period 74f during which the engine is started (and the starter is disconnected from the battery).

During period 74a (about time 0.0 seconds) the open circuit voltage of the battery is about 12.6 V. During period 704*b* (about time 0.01 seconds) a relatively large drop from the voltage of the battery occurs (to about 9.0 V). This drop corresponds to the connection of the starter to the battery and a resulting initial high current draw by the starter. During period 74*c* (about time 0.01 to 0.05 seconds) the voltage of the battery recovers to about 11.1 V.

Referring further to FIG. 5, the voltage of the battery "ripples" or oscillates during period 74*d* (about time 0.05 to 1.2 seconds)—referred to as a "ripple interval." A minimum voltage value 76 during the ripple interval corresponds to the compression of gas by a piston of the engine. A maximum voltage value 78 during the ripple interval corresponds to the expansion of the gas in the engine. According to a particularly preferred embodiment, the ripple interval is defined by a period of 100 milliseconds to 480 milliseconds after the starter is connected to the battery. The difference between each minimum voltage value 76 and each maximum voltage value 78 during period 74*d* may be averaged to provide an average amplitude of the voltage during the ripple interval.

Referring further to FIG. 5, the engine starts at the beginning of period 74*e* (about time 1.2 to 1.4 seconds). Without intending to be limited to any particular theory, it is believed that the amplitude of the voltage during the ripple interval decreases relative to the amplitude of the voltage during period 74*e* because the starter is no longer cranking the engine.

Referring further to FIG. 5, the starter is disconnected from the battery at the beginning of period 74*f* (at about time 1.4 to 2.0 seconds). Without intending to be limited to any particular theory, it is believed that a relatively steep rise in voltage occurs during period 74*f* due to disconnection of the starter from the battery and from charging of the battery by the alternator of the vehicle.

Figure 6:
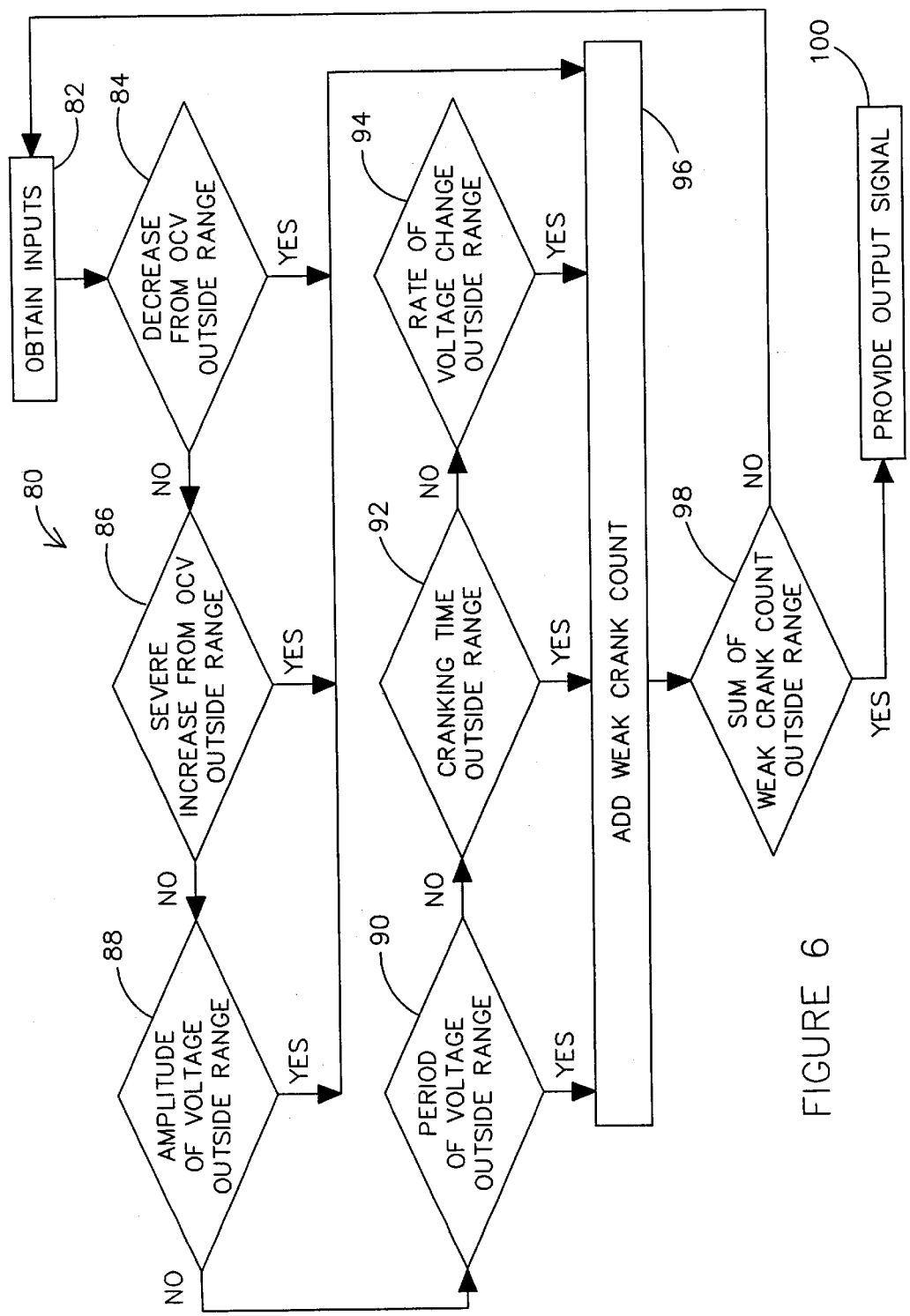
FIG. 6 is a flow diagram of a routine for predicting whether a battery may deliver a sufficient amount of power for a sufficient amount of time according to an alternative embodiment.

A routine 80 for predicting whether a battery may deliver a sufficient amount of power for a sufficient amount of time (based on a weak crank of the engine) is shown in FIG. 6 according to an alternative embodiment. Routine 80 uses an input signal obtained from sensors (or otherwise acquired) representative of the voltage of the battery (step 82) during at least one of periods 74*a*–74*f* (see FIG. 5). The battery monitoring system makes a determination whether the monitored drop in voltage of the battery from open circuit voltage (period 74*a* in FIG. 5) to the voltage during the ripple interval (period 74*d* in FIG. 5) is within a range of pre-determined values (step 84). According to a preferred embodiment, the routine compares the average open circuit voltage to the average voltage during the ripple interval (over a pre-determined number of starts of the engine with reference to a new, fully charged battery) to determine an "average voltage drop." This average voltage drop is set as a range of pre-determined values according to a preferred embodiment, or some other range of pre-determined values (e.g. about 1.4 volts plus 20 percent, i.e. about 1.4 V to 1.7 V) according to an alternative embodiment. If the monitored drop in voltage of the battery from open circuit voltage to the voltage during the ripple interval is outside the range of pre-determined values, then a count is recorded representative of a weak crank of the engine (step 96). If the sum of the counts is not outside a range of pre-determined values (e.g. 9 counts in the last 12 attempts to start the engine) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Figure 7:
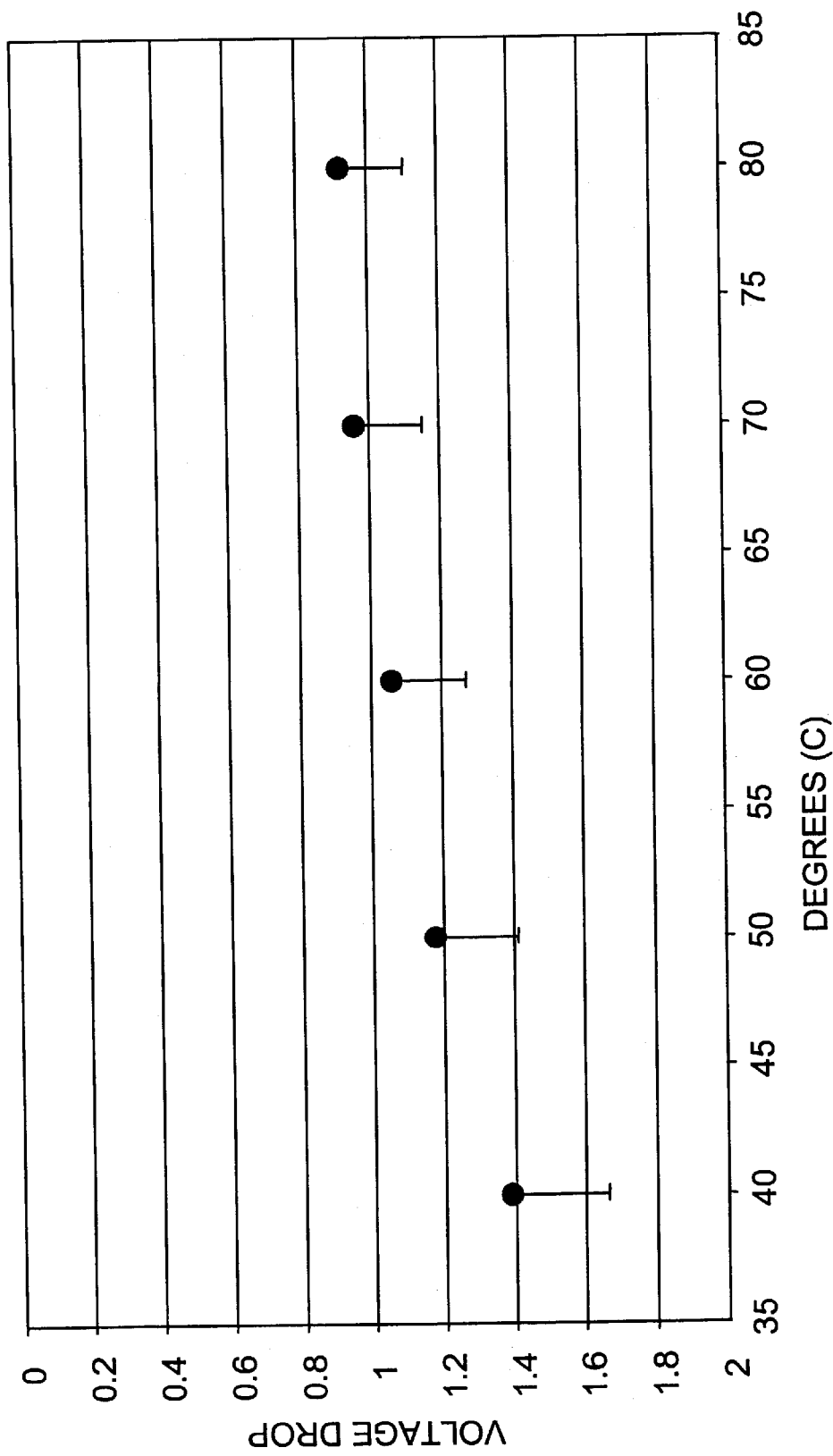
FIG. 7 is a graph of the voltage drop of a battery during the starting of an engine of a vehicle versus temperature according to an exemplary embodiment.

The monitored drop in voltage of the battery from open circuit voltage to the voltage of the ripple interval may be adjusted due to the temperature of the battery according to an alternative embodiment. Without intending to be limited to any particular theory, it is believed that the drop in voltage of the battery from open circuit voltage to the voltage of the ripple interval may increase as temperature decreases. The drop in voltage of the battery from open circuit voltage to the voltage of the ripple interval at various temperatures is shown in FIG. 7 according to an exemplary embodiment. As shown in FIG. 7, the drop in voltage of the battery at 40 degrees Celsius from open circuit voltage to the voltage of the ripple interval is about 1.4 V. A pre-determined range of drops in voltage of the battery from open circuit voltage to the voltage of the ripple interval may be set (e.g. about 1.4 V–1.7 V, i.e. about 20 percent greater than the average drop in voltage of the battery from open circuit voltage to the voltage of the ripple interval at that temperature) according to another alternative embodiment.

Referring further to FIG. 6, the battery monitoring system makes a determination whether the monitored open circuit voltage of the battery (period 74*a* in FIG. 5) is within a range of pre-determined values (step 86). According to a preferred embodiment, the routine determines an average open circuit voltage over a pre-determined number of starts of the engine with reference to a new, fully charged battery (e.g. about 12.6 V plus or minus 20 percent, i.e. 10.1–15.1 V). If the monitored open circuit voltage of the battery is outside the range of pre-determined values, then a count is recorded representative of a weak crank of the engine (step 96). Without intending to be limited to any particular theory, it is believed that a severe increase from the open circuit voltage of the battery (e.g. from about 12.6 V–12.8 V to about 13.3 V–13.5 V) over time (e.g. days, months, etc.) may indicate that the battery is experiencing water and electrolyte loss. If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored amplitude of the voltage of the battery during the ripple interval (period 74*d* in FIG. 5) is within a range of pre-determined values (step 88). According to a preferred embodiment, the routine determines an average amplitude of the voltage during the ripple interval over a pre-determined number of starts of the engine with reference to a new, fully charged battery (e.g. about 0.1 V plus or minus 20 percent, i.e. about 0.08 V to 1.02 V). If the monitored amplitude of the voltage of the battery during the ripple interval is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored "period" of the voltage of the battery during the ripple interval (period 74*d* in FIG. 5) (i.e. the time interval between two successive occurrences of minimum voltage value 74 during the ripple interval) is within a range of pre-determined values (step 90). According to a preferred embodiment, the routine determines an average period of the voltage during the ripple interval over a pre-determined number of starts of the engine with reference to a new, fully charged battery (e.g. about 11.1 V plus or minus 20 percent, i.e. about 8.9 V to 13.3 V). Without intending to be limited to any particular theory, it is believed that an increase in the period of the voltage during the ripple interval may indicate there is relatively little life remaining in the battery (i.e. it takes a longer duration for the starter to crank the engine). If the monitored period of the voltage of the battery during the ripple interval is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored cranking time required to start the engine (period 74d in FIG. 5) is within a range of pre-determined values (step 92). According to a preferred embodiment, the routine determines an average cranking time required to start the engine over a pre-determined number of starts of the engine with reference to a new, fully charged battery (e.g. less than about 1.2 seconds plus 20 percent, i.e. about 0 to 1.4 seconds). If the monitored cranking time required to start the engine is outside the range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the battery may not deliver a sufficient amount of power for a sufficient amount of time.

Referring further to FIG. 6, the battery monitoring system makes a determination whether the monitored rate of change of the voltage of the battery during the ripple interval (period 74d in FIG. 5) is within a range of pre-determined values (step 94). According to a preferred embodiment, the routine determines an average rate of change of the voltage of the battery during the ripple interval over a pre-determined number of starts of the engine with reference to a new, fully charged battery (e.g. a rate greater than about 0). If the rate of change of the voltage of the battery during the ripple interval is outside a range of pre-determined values, then a count is recorded representative of a weak crank of the engine (step 96). If the sum of the counts is not outside a range of pre-determined values (e.g. 9 counts in the last 12 attempts to start the vehicle) (step 98), then routine 80 continues to obtain inputs (step 82). If the sum of the counts is outside the range of pre-determined values (step 98), then an output signal is provided representative of a warning that the may not deliver a sufficient amount of power for a sufficient amount of time.

According to a particularly preferred embodiment, routine 80 is run after routine 50 makes a determination that there is relatively little life remaining in the battery (e.g. 10 percent life remaining, about 330 days of life remaining, more than 1000 life cycling counts used by the battery, etc.). The pre-determined values of routine 80 may be adjusted according to the amount of life remaining in the battery as determined by routine 50 according to an alternative embodiment.

The input signals (or combination of input signals) may be representative of conditions or states of the battery system such as voltage of the battery, current drawn by loads connected to the battery, resistance of the battery, temperature of the battery, time, etc. according to any preferred or alternative embodiments. The input signals may also relate to a characteristic of the battery (such as model number, purchase date, installation date, size, capacity, cold cranking capability rating, reserve capacity rating, etc.) according to any preferred or alternative embodiment. The range of the pre-determined values that are compared to the input signals by the battery management system may be preprogrammed or determined during operation, use, testing, etc. of the vehicle according to any preferred or alternative embodiments. The range of the pre-determined values may be adjusted or calibrated over time according to any preferred or alternative embodiments. The "other devices" for providing inputs to the battery management system may comprise an input device such as a keyboard, display (e.g. touch screen), etc. according to alternative embodiments. The other devices may include a "remote connection" to the battery management system such as a wireless device (e.g. HomeLink (™) wireless control system, key fob, cellular or digital device, etc.) communicated by a variety of methods and protocols (e.g. infrared, radio frequency, Bluetooth, Wide Application Protocol, etc.) according to alternative embodiments. The "other devices" may comprise a magnetically coupled communication port such as a Manual Swipe Magnetic Card Low-Co Reader/Writer model no. RS-232 commercially available from Uniform Industrial Corp., Fremont, Calif., USA according to a particularly preferred embodiment.

The battery management system may comprise a computing device, microprocessor, controller or programmable logic controller (PLC) for implementing a control program, and which provides output signals based on input signals provided by a sensor or that are otherwise acquired. Any suitable computing device of any type may be included in the battery management system according to alternative embodiments. For example, computing devices of a type that may comprise a microprocessor, microcomputer or programmable digital processor, with associated software, operating systems and/or any other associated programs to implement the control program may be employed. The controller and its associated control program may be implemented in hardware, software or a combination thereof, or in a central program implemented in any of a variety of forms according to alternative embodiments. A single control system may regulate the controller for the battery management system and the controller for the vehicle according to an alternative embodiment.

It is important to note that the use of the term battery "management" or "battery management system" is not intended as a term of limitation insofar as any function relating to the battery, including monitoring, charging, discharging, recharging, conditioning, connecting, disconnecting, reconnecting, etc., is intended to be within the scope of the term.

It is important to note that the construction and arrangement of the elements of the battery monitoring system as shown in the preferred and other exemplary embodiments is illustrative only. Although only a few embodiments of the present invention have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, orientations, etc.) without materially departing from the novel teachings and advantages of the subject matter recited in the claims. For example, the battery management system may be installed directly on the battery or otherwise electrically connected to the battery according to alternative embodiments. Accordingly, all such modifications are intended to be included within the scope of the present invention as defined in the appended claims. The input signals may be representative of the current drawn from the battery according to an alternative embodiment. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the preferred and other exemplary embodiments without departing from the spirit of the present invention as expressed in the appended claims.

What is claimed is:

1. A system for monitoring a battery for a vehicle comprising:
    means for acquiring a value representative of a first period of time during which the battery will deliver a sufficient amount of power;
    means for measuring a set of parameters comprising a voltage of the battery and a temperature of the battery during a second period of time;
    means for predicting whether the battery will deliver the sufficient amount of power during a third period of time less than the first period of time;
    wherein an output signal is provided if the means for predicting determines that the battery will deliver the sufficient amount of power during the third period of time.

2. The system of claim 1 wherein the output signal is representative of an amount of life remaining in the battery.

3. The system of claim 1 wherein the output signal is representative of at least one of an amount of a cold cranking capability, a reserve capacity and a cycling capability remaining in the battery.

4. The system of claim 1 further comprising means for continuously recording the set of parameters.

5. The system of claim 4 wherein the second period of time is adjusted corresponding to at least one of the voltage, the temperature and a state of charge of the battery.

6. The system of claim 5 wherein the second period of time is increased if the means for measuring provides a signal that the battery undergoes at least one of a high voltage, a high temperature and a low state of charge.

7. The system of claim 5 wherein the value corresponds to at least one of a cold cranking rating, a reserve capacity rating and a cycling capability rating of the battery when new and fully charged.

8. The system of claim 5 wherein the output signal is provided if the means for predicting determines that the first period of time less the second period of time is greater than the third period of time.

9. The system of claim 5 wherein the means for measuring comprises a sensor.

10. The system of claim 9 wherein the means for predicting comprises a controller.

11. The system of claim 9 wherein the value is less than about 3300 days.

12. A system for determining whether a battery for a vehicle will deliver a sufficient amount of power for a sufficient amount of time comprising:
    a sensor configured to provide an input signal representative of a voltage of the battery during at least one of a first period over which the starter is disconnected from the battery, a second period over which the starter cranks the engine, and a third period over which the engine is started;
    a controller configured to determine a voltage of the battery during at least one of the first period, a minimum voltage of the battery during the second period, and a maximum voltage of the battery during the second period;
    wherein the controller is configured to provide an output signal if the voltage of the battery is outside a range of pre-determined values during at least one of the first period, the second period, and the third period.

13. The system of claim 12 wherein the output signal comprises a warning representative of a weak crank of the engine.

14. The system of claim 12 wherein the output signal is representative of an amount of life lost from the battery.

15. The system of claim 12 wherein the controller is configured to provide the output signal if the voltage of the battery is outside a range of pre-determined values during the second period.

16. The system of claim 15 wherein the controller is configured to provide the output signal if the difference between the voltage of the battery during the first period and the voltage of the battery during the second period is outside a range of pre-determined values.

17. The system of claim 15 wherein the controller is configured to provide the output signal if a difference between the minimum voltage of the battery and the maximum voltage of the battery is outside a range of pre-determined values during the second period.

18. The battery management system of claim 15 wherein the controller is configured to provide the output signal if a difference between an average minimum voltage of the battery and an average maximum voltage of the battery is outside a range of pre-determined values during the second period.

19. The battery management system of claim 12 wherein the controller is configured to provide the output signal if a period between a first minimum voltage and a second minimum voltage of the battery is outside a range of pre-determined values during the second period.

20. The system of claim 12 wherein the controller is configured to provide the output signal if an average period between a first average minimum voltage of the battery and a second average minimum voltage of the battery is outside a range of pre-determined values during the second period.

21. The system of claim 12 wherein the controller is configured to provide the output signal if the voltage of the battery is outside a range of pre-determined values during the third period.

22. The system of claim 21 wherein the controller is configured to provide the output signal if an average voltage of the battery for a pre-determined number of starts of the engine is outside a range of pre-determined values during the third period.

23. The system of claim 12 wherein the controller is configured to provide the output signal if the duration of the second period is outside a range of pre-determined values for a pre-determined number of starts of the engine.

24. A system for determining whether a battery for a vehicle will deliver a sufficient amount of power for a sufficient amount of time comprising:
    means for providing a first input signal representative of a temperature of the battery during a period;

means for providing a second input signal representative of a voltage of the battery during the period;

means for providing a third input signal representative of a duration of the period;

means for determining an amount of life lost by the battery during the period corresponding to the first input signal, the second input signal, and the third input signal;

wherein the means for determining the amount of life lost by the battery during the period provides an output signal if the amount of life lost by the battery during the period is outside a range of pre-determined values.

25. The system of claim 24 wherein the range of pre-determined values corresponds to an amount of power required to start the vehicle.

* * * * *